(12) United States Patent
Kim et al.

(10) Patent No.: US 9,910,596 B2
(45) Date of Patent: Mar. 6, 2018

(54) ELECTRONIC DEVICE AND METHOD FOR FABRICATING THE SAME

(71) Applicant: SK hynix Inc., Icheon-Si (KR)

(72) Inventors: Chi-Ho Kim, Icheon-si (KR); Ki-Seon Park, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 15/152,315

(22) Filed: May 11, 2016

(65) Prior Publication Data

US 2017/0192678 A1  Jul. 6, 2017

(30) Foreign Application Priority Data

Dec. 30, 2015  (KR) .................. 10-2015-0189269

(51) Int. Cl.
| | |
|---|---|
| *H01L 43/02* | (2006.01) |
| *G06F 3/06* | (2006.01) |
| *G06F 12/08* | (2016.01) |
| *G06F 13/10* | (2006.01) |
| *G06F 13/16* | (2006.01) |
| *H01L 43/08* | (2006.01) |
| *H01L 45/00* | (2006.01) |

(52) U.S. Cl.
CPC .......... *G06F 3/0604* (2013.01); *G06F 3/0656* (2013.01); *G06F 3/0679* (2013.01); *G06F 12/08* (2013.01); *G06F 13/102* (2013.01); *G06F 13/1673* (2013.01); *H01L 43/02* (2013.01); *H01L 43/08* (2013.01); *H01L 45/06* (2013.01); *H01L 45/1233* (2013.01); *G06F 2212/2024* (2013.01); *G06F 2212/60* (2013.01)

(58) Field of Classification Search
CPC ..... H01L 43/02; H01L 43/08; H01L 45/1233; H01L 45/1253
See application file for complete search history.

(56) References Cited

U.S. PATENT DOCUMENTS

| | | |
|---|---|---|
| 2014/0021426 A1 | 1/2014 | Lee et al. |
| 2014/0284733 A1* | 9/2014 | Watanabe ............... H01L 43/10 257/421 |
| 2015/0137287 A1 | 5/2015 | Kim et al. |
| 2015/0263271 A1* | 9/2015 | Nagamine ............... H01L 43/10 257/295 |
| 2016/0149120 A1 | 5/2016 | Park et al. |

FOREIGN PATENT DOCUMENTS

| KR | 10-2014-0142929 A | 12/2014 |
|---|---|---|
| KR | 10-2016-0061746 A | 6/2016 |

* cited by examiner

*Primary Examiner* — Allison P Bernstein
(74) *Attorney, Agent, or Firm* — Perkins Coie LLP

(57) ABSTRACT

Provided is an electronic device including a semiconductor memory. The semiconductor memory may include: an interlayer dielectric layer formed over a substrate and having a contact hole; a contact plug formed in a lower part of the contact hole; a contact pad formed in an upper part of the contact hole; an amorphous buffer layer interposed between the contact plug and the contact pad; and a variable resistance element formed over the contact pad.

17 Claims, 7 Drawing Sheets

ELECTRONIC DEVICE AND METHOD FOR FABRICATING THE SAME

CROSS-REFERENCE TO RELATED APPLICATIONS

This patent document claims priority of Korean Patent Application No. 10-2015-0189269, entitled "ELECTRONIC DEVICE AND METHOD FOR FABRICATING THE SAME" and filed on Dec. 30, 2015, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which includes a semiconductor memory with improved reliability and a method for fabricating the same.

In an implementation, an electronic device including a semiconductor memory. The semiconductor memory may include: an interlayer dielectric layer formed over a substrate and having a contact hole; a contact plug formed in a lower part of the contact hole; a contact pad formed in an upper part of the contact hole; an amorphous buffer layer interposed between the contact plug and the contact pad; and a variable resistance element formed over the contact pad.

The amorphous buffer layer may have a shape of a plate interposed between the contact plug and the contact pad. The amorphous buffer layer may have a shape of a liner interposed between the contact plug and the contact pad and between the contact pad and the contact hole. The end of the amorphous buffer layer interposed between the contact pad and the contact hole may be positioned in the contact pad. The amorphous buffer layer may have a single-layer or multilayer structure including a metal, a nitride of the metal, or an oxide of the metal, the metal including titanium (Ti), hafnium (Hf), zirconium (Zr), manganese (Mn), chrome (Cr), zinc (Zn), magnesium (Mg), aluminum (Al), tungsten (W), or tantalum (Ta). The amorphous buffer layer may include one or more dopants including germanium (Ge), argon (Ar), xenon (Xe), indium (In), selenium (Sb), or arsenic (As) doped with which the metal, the nitride of the metal, or the oxide of the metal is doped. The amorphous buffer layer may include a carbon containing layer or silicon containing layer. The contact plug and the contact pad may include different materials. The variable resistance element may have a smaller critical dimension (CD) than the contact pad. The variable resistance element may include a magnetic tunnel junction (MTJ) having a tunnel barrier interposed between two magnetic substances. The variable resistance element may include a metal oxide, a phase change material, or a ferroelectric material.

The electronic device may further comprising a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further comprising a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further comprising a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further comprising a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further comprising a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In an implementation, a method for fabricating an electronic device may include: forming a contact hole in an interlayer dielectric layer over a substrate; forming a contact plug in a part of the contact hole; forming an amorphous buffer layer over the contact plug; forming a contact pad over the amorphous buffer layer to fill a remaining part of the contact hole so that the contact pad is separated by the amorphous buffer layer from the contact plug; and forming a variable resistance element over the contact pad.

The forming of the amorphous buffer layer may include: forming an amorphous buffer layer on an entire surface of the contact plug; and performing a blanket etch process. The forming of the amorphous buffer layer may include: forming an amorphous buffer layer along a surface of the contact plug and a side of the contact hole; and performing a planarization process until the interlayer dielectric layer is exposed. The forming of the amorphous buffer layer may include: forming an amorphous buffer layer along a surface of the contact plug and a side of the contact hole; forming a sacrificial layer over the amorphous buffer layer; and performing wet etching using the sacrificial layer as an etch barrier. The amorphous buffer layer may have a single-layer or multilayer structure including a metal, a nitride of the metal, or an oxide of the metal, the metal including Ti, Hf, Zr, Mn, Cr, Zn, Mg, Al, W, or Ta. The amorphous buffer layer may include one or more dopants including Ge, Ar, Xe, In, Sb, or As doped with which the metal, the nitride of the metal, or the oxide of the metal is doped. The amorphous buffer layer may include a carbon containing layer or silicon containing layer. The contact plug and the contact pad may be formed to include different materials from each other. The variable resistance element may have a smaller CD than the contact pad.

DETAILED DESCRIPTION

Figure 1:
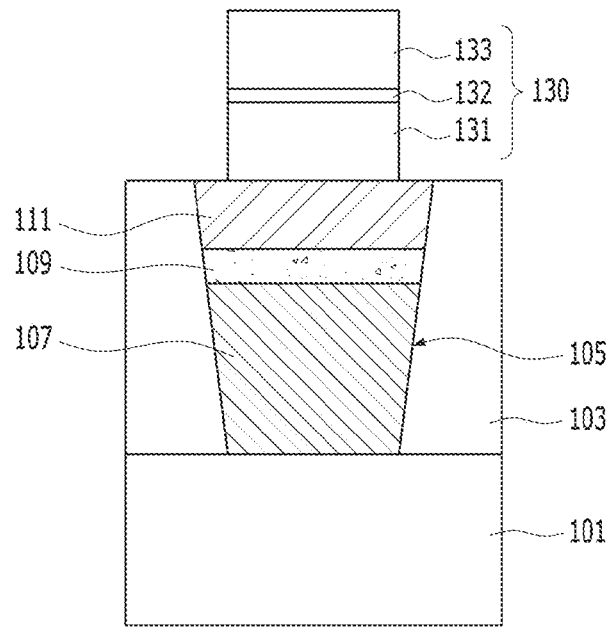
FIG. 1 is a cross-sectional view illustrating a semiconductor memory in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

The implementations relate to an electronic device including a semiconductor memory with improved reliability and a method for fabricating the same. In the following descriptions, the case in which a variable resistance element is used as a storage element will be taken as an example for describing a semiconductor memory in accordance with an implementation. When the reliability of the semiconductor memory is improved, it may indicate that the stability for a process of forming a variable resistance element and the characteristic (or performance) of the variable resistance element are improved.

For reference, the variable resistance element refers to an element which can switch between different resistance states in response to a bias (for example, current or voltage) applied thereto. The variable resistance element may include a variable resistance material which is used in a resistive memory which stores and erases information through the change of the resistance characteristic. The variable resistance material may include various materials used in RRAM, PRAM, FRAM, MRAM, or STTRAM and the like. For example, the variable resistance material may include a ferromagnetic material, a transition metal oxide insulator, a metal oxide insulator containing a perovskite-based material, a phase change insulator containing a chalcogenide-based material, or a ferroelectric insulator and the like.

Hereafter, for convenience of description, a magnetic tunnel junction (MTJ) having a tunnel barrier inserted between two magnetic substances will be taken as an example of the variable resistance element. Various other implementations for variable resistance elements that are different from the MTJ may be used to implement the disclosed technology.

Figure 2:
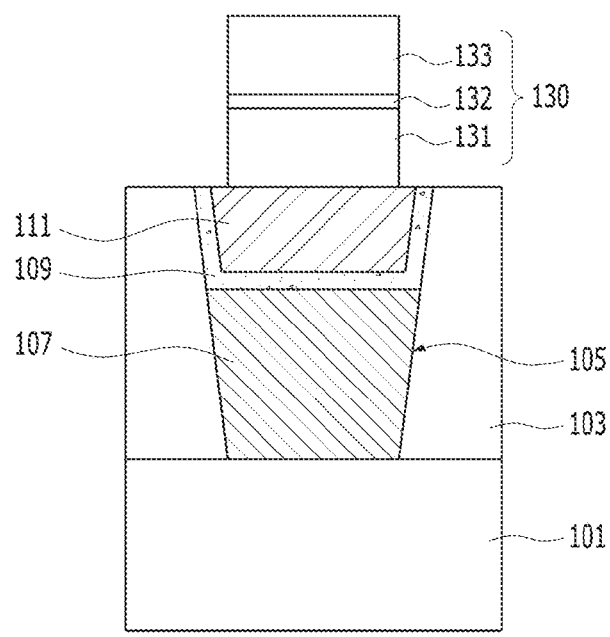
FIGS. 2 and 3 are cross-sectional views illustrating modifications of the semiconductor memory in accordance with the present implementation.
Figure 3:
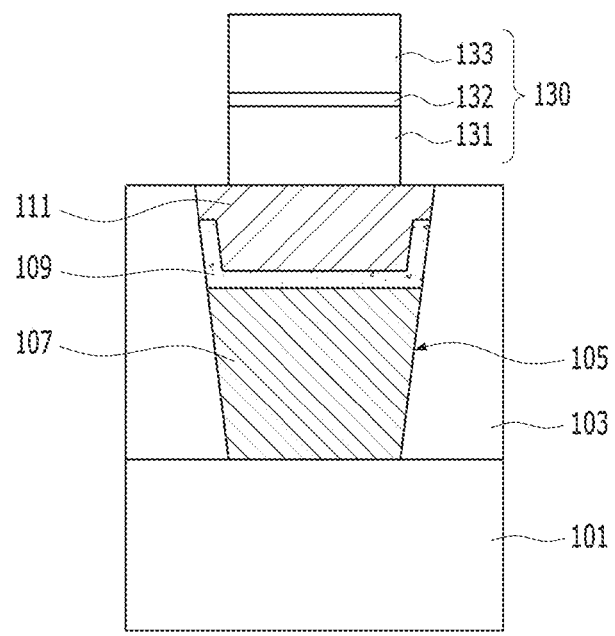

FIG. 1 is a cross-sectional view illustrating a semiconductor memory in accordance with an implementation. FIGS. 2 and 3 are cross-sectional views illustrating modifications of the semiconductor memory in accordance with the present implementation. For convenience of description, like components in the implementation and the modifications will be represented by the same reference numerals.

As illustrated in FIG. 1, the semiconductor memory in accordance with the implementation may include an interlayer dielectric layer 103, a contact hole 105, a contact plug 107, a contact pad 111, an amorphous buffer layer 109, and a variable resistance element 130. The interlayer dielectric layer 103 may be formed over a substrate 101 having a predetermined structure formed therein. Although in FIG. 1, the contact hole 105 has been shown, the shape is not limited to the hole only and other recess structures are also possible. The contact hole 105 may be formed to expose the substrate 101 through the interlayer dielectric layer 103. The contact plug 107 may be formed to occupy or gap-fill a part of the contact hole 105. The contact pad 111 may be formed over the contact plug 107 so as to occupy or gap-fill another part of the contact hole 105. The amorphous buffer layer 109 may be interposed between the contact plug 107 and the contact pad 111. The variable resistance element 130 may be formed over the contact pad 111.

The variable resistance element 130 may include a MTJ structure which includes a free layer 131 having a changeable magnetization direction, a pinned layer 133 having a pinned magnetization direction, and a tunnel barrier layer 132 interposed between the free layer 131 and the pinned layer 133.

In the MTJ structure, the free layer 131 may store data according to the magnetization direction, because the magnetization direction is variable. The variable magnetization direction of the free layer 131 causes a variable resistance value of the MTJ structure to change and thus allows to store different data or represent different data bits based on the different relative directions of the magnetization directions of the free layer 131 and the pinned layer 133. Thus, the free layer 131 may be referred to as a storage layer. The magnetization direction of the free layer 131 may be changed by spin transfer torque. The pinned layer 133 may be referred to as a reference layer, because the pinned magnetization direction thereof is not variable. The magnetization direction of the pinned layer 131 can be compared to the magnetization direction of the free layer 131, and the relative directions of the magnetization direction of the free layer 131 and the pinned layer 133 determine data or data value to be stored in the MTJ structure. The tunnel barrier layer 132 may change the magnetization direction of the free layer 131 through tunneling of electrons. Each of the free layer 131 and the pinned layer 133 may have a magnetization direction perpendicular to the surface thereof.

According to a voltage or current applied to the variable resistance element 130, the magnetization direction of the free layer 131 may be changed to be parallel or anti-parallel to the magnetization direction of the pinned layer 133. Thus, the variable resistance element 130 may switch between a low-resistance state in which the magnetization direction is parallel and a high-resistance state in which the magnetization direction is anti-parallel, and store different data through the switching operation. In this manner, the variable resistance element 130 may function as a memory cell.

Each of the free layer 131 and the pinned layer 133 may have a single-layer or multilayer structure including a ferromagnetic material. For example, each of the free layer 131 and the pinned layer 133 may include an alloy based on Fe, Ni, or Co, for example, Co—Fe—B alloy, Co—Fe—B—X alloy, Fe—Pt alloy, Fe—Pd alloy, Co—Pd alloy, Co—Pt alloy, Fe—Ni—Pt alloy, Co—Fe—Pt alloy, Co—Ni—Pt alloy, Fe—Pd alloy, Co—Pd alloy, Co—Pt alloy, Fe—Ni— Pt alloy, Co—Fe—Pt alloy, or Co—Ni—Pt alloy, where X may represent Al, Si, Ti, V, Cr, Ni, Ga, Ge, Zr, Nb, Mo, Pd, Ag, Hf, Ta, W, or Pt. In some implementations, each of the free layer 131 and the pinned layer 133 may include a stacked structure such as Co/Pt or Co/Pd or a stacked structure in which a magnetic substance and a non-magnetic substance are alternately stacked. The tunnel barrier layer 132 may include dielectric oxide such as MgO, CaO, SrO, TiO, VO, or NbO.

The substrate 101 may include a semiconductor substrate. The semiconductor substrate may have a single crystal state, and include a silicon-containing material. The semiconductor substrate may include a single-crystal silicon containing material. For example, the substrate 101 may include a bulk silicon substrate or SOI (Silicon On Insulator) substrate in which a support substrate, a buried insulator layer, and a single crystal silicon layer are sequentially stacked.

The predetermined structure formed in the substrate 101 may include a switching element (not illustrated). The switching element may be electrically coupled to one end of the variable resistance element 130 so as to control whether to supply a bias to the variable resistance element 130, and include a transistor, or a diode and the like. One end of the switching element may be electrically coupled to the contact plug 107, and the other end of the switching element may be electrically coupled to a conductive line (not illustrated), for example, a source line.

The interlayer dielectric layer 103 may include any single layer or two or more layers including oxide, nitride, or oxynitride. The contact hole 105 formed in the interlayer dielectric layer 103 may have vertical sidewalls or inclined sidewalls as illustrated in the drawings. The contact hole 105 having inclined sidewalls may be formed in such a shape that the critical dimension (CD) of the contact hole 105 gradually decreases as the depth from the top surface of the interlayer dielectric layer 103 increases. When the contact hole 105 has inclined sidewalls, the difficulty level of the process of forming the contact plug 107, the buffer layer 109, and the contact pad 111 can be reduced, and the contact area between the contact pad 111 and the variable resistance element 130 can be easily secured. Furthermore, although not illustrated in the drawings, the contact hole 105 may have a wineglass shape.

The top surface of the contact plug 107 may be positioned at a lower level than the top surface of the interlayer dielectric layer 103 or the entrance of the contact hole 105. That is, the contact plug 107 may have a shape of occupying or gap-filling the lower region of the contact hole 105. By forming the contact plug 107 in the lower region of the contact hole 105, a space for forming the amorphous buffer layer 109 and the contact pad 111 can be provided. Further, it is possible to remove a defect which occurs in the contact plug 107 during the process of forming the contact plug 107, for example, a void or seam. This structure will be described in more detail when explaining a fabrication method in the later part of the present disclosure. The contact plug 107 may have a single-layer structure or multilayer structure including various conductive materials such as metal or metal oxide, which have an excellent burial characteristic and high electrical conductivity. For example, the contact plug 107 may include tungsten (W) or titanium nitride (TiN).

The contact pad 111 may serve as an electrode of the variable resistance element 130. Furthermore, the contact pad 111 may serve to improve the characteristic of the variable resistance element 130. For example, the contact pad 111 may be used to improve the perpendicular magnetic anisotropy or crystallinity of a layer positioned over the contact pad 111, for example, the free layer 131. For this structure, the contact pad 111 may have a greater CD than the variable resistance element 130. In this implementation, the variable resistance element 130 may be completely overlapped with the contact pad 111, and positioned only over the contact pad 111. The contact pad 111 may include a material different from the contact plug 107. The contact pad 111 may have a singe-layer structure or multilayer structure including various conductive materials such as metal or metal nitride.

The amorphous buffer layer 109 interposed between the contact plug 107 and the contact pad 111 may serve to improve the characteristic of the variable resistance element 130 while suppressing the increase of driving current required for switching the variable resistance element 130. When the lower contact structure of the variable resistance element 130, for example, the contact plug 107 and the contact pad 111 have an amorphous crystal structure, the characteristic of the variable resistance element 130 may be improved, but the driving current required for switching the variable resistance element 130 may be increased. In the present implementation, as the amorphous buffer layer 109 is interposed between the contact plug 107 and the contact pad 111, the characteristic of the variable resistance element 130 can be improved while the increase of driving current required for switching the variable resistance element 130 is suppressed.

Specifically, the amorphous buffer layer 109 may serve as a barrier which blocks the contact plug 107 such that the crystallinity of the contact plug 107 does not have an influence on the crystallinity of the contact pad 111 or the impact to the crystallinity of the contact pad 111 by the crystallinity of the contact plug 107 can be reduced by the presence of the amorphous buffer layer 109. Through the amorphous buffer layer 109, the crystallinity quality of the contact pad 111 can be improved. Thus, the characteristic of the variable resistance element 130 formed over the contact pad 111 can be improved.

The amorphous buffer layer 109 may be formed over the contact plug 107 so as to gap-fill a defect of the contact plug 107, for example, a void or seam. Thus, the amorphous buffer layer 109 can prevent dishing of the contact pad 111, and improve the roughness of the surface of the contact pad 111. This will be described in more detail when explaining the fabrication method in the later part of the present disclosure.

The amorphous buffer layer 109 may serve to buffer or relieve a profile change and stress, which are caused by a difference in expansion coefficients between different materials of the contact plug 107 and the contact pad 111.

The amorphous buffer layer 109 may serve as a barrier which prevents foreign matters from diffusing into the contact pad 111 through the contact plug 107. For example, when the contact plug 107 includes tungsten (W), the amorphous buffer layer 109 may block diffusion of boron (B) or fluorine (F) remaining in the contact plug 107 into the contact pad 111 and the variable resistance element 130. At this time, since the buffer layer 109 has an amorphous state in which irregular crystal grains are formed, the buffer layer 109 can effectively block the diffusion of foreign matters.

The amorphous buffer layer 109 may have a single-layer or multilayer structure including a metal, a nitride of the metal, or an oxide of the metal. The metal may include titanium (Ti), hafnium (Hf), zirconium (Zr), manganese (Mn), chrome (Cr), zinc (Zn), magnesium (Mg), aluminum (Al), tungsten (W), or tantalum (Ta). For example, the amorphous buffer layer 109 may include TaN, TiN, or WN and the like.

The amorphous buffer layer 109 may include one or more dopants including germanium (Ge), argon (Ar), xenon (Xe), indium (In), selenium (Se), and arsenic (As) doped with the above-described metal, metal nitride, or metal oxide. The above-described dopants may be implanted to induce the buffer layer 109 to have an amorphous state or create an amorphous state during the process. For example, the amorphous buffer layer 109 may include Ta doped with Ge. The amorphous buffer layer 109 may include a carbon containing layer or silicon containing layer. The carbon containing layer or silicon containing layer may be doped with a predetermined impurity to have conductivity. At this time, the impurity may include an N-type impurity such as phosphorous (P) or As, or a P-type impurity such as B.

As illustrated in FIG. 1, the amorphous buffer layer 109 may be interposed in the form of a plate between the contact pad 111 and the contact plug 107. Other implementations are also possible regarding the shape of the amorphous buffer layer 109 formed between the contact pad 111 and the contact plug 107. For example, as illustrated in FIGS. 2 and 3, the amorphous buffer layer 109 may be interposed in the form of a liner inserted between the contact pad 111 and the contact plug 107 and between the contact pad 111 and the contact hole 105. For example, the amorphous buffer layer 109 may have a shape to surround the bottom surface of the contact pad 111 and at least a portion of a side of the contact pad 111, such as conforming to the side and bottom surfaces of the contact pad 111. At this time, as illustrated in FIG. 2, the amorphous buffer layer 109 inserted between the contact pad 111 and the contact hole 105 may have a portion exposed, for example, at the upper surface of the interlayer dielectric layer 103. As another example, as illustrated in FIG. 3, the amorphous buffer layer 109 inserted between the contact pad 111 and the contact hole 105 may be positioned in the contact pad 111 without having any portion exposed. In FIG. 3, the amorphous buffer layer 109 is positioned in the lower portion of the contact pad 111, and thus, a contact margin between the contact pad 111 and the variable resistance element 130 can be more easily secured. The shapes of the amorphous buffer layer 109 depend on differences in the fabrication process, and a suitable shape of the amorphous buffer layer 109 can be selected according to required characteristics of the variable resistance element. For example, when the characteristic of the variable resistance element is deteriorated by a defect of the contact plug 107, for example, a void, the amorphous buffer layer 109 can be formed in a plate shape. When the crystallinity of the contact pad 111 is degraded to deteriorate the characteristic of the variable resistance element, the amorphous buffer layer 109 can be formed in a liner shape.

As the semiconductor memory in accordance with the present implementation includes the amorphous buffer layer 109, the semiconductor memory can improve the stability for the process of forming the variable resistance element 130 and the characteristic of the variable resistance element 130.

FIGS. 4A to 4D are cross-sectional views illustrating a method for fabricating a semiconductor memory in accordance with an implementation.

Figure 4A:
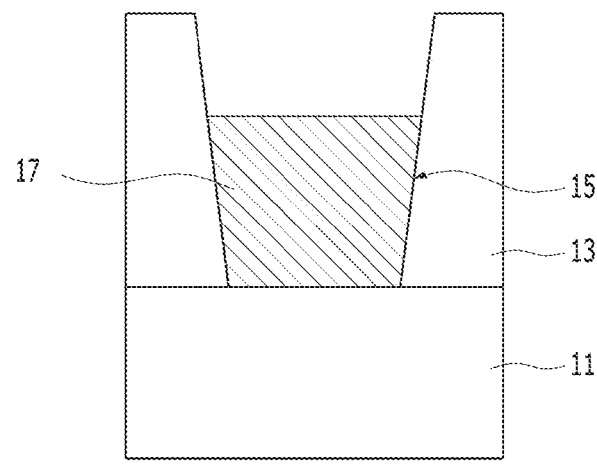
FIGS. 4A to 4D are cross-sectional views illustrating a method for fabricating a semiconductor memory in accordance with an implementation.

As illustrated in FIG. 4A, an interlayer dielectric layer 13 may be formed over a substrate 11 having a predetermined structure formed therein. The predetermined structure may include a switching element (not illustrated). The interlayer dielectric layer 13 may include any single layer or two or more layers selected from the group consisting of or including oxide, nitride, or oxynitride.

Then, a mask pattern (not illustrated) may be formed over the interlayer dielectric layer 13. Using the mask pattern as an etch barrier, the interlayer dielectric layer 13 may be etched to form a contact hole 15 which exposes the substrate 11. The contact hole 15 may be formed through dry etching. The contact hole 15 may have vertical sidewalls or inclined sidewalls. When the contact hole 15 has inclined sidewall as illustrated in FIG. 4A, the CD of the contact hole 15 may gradually decrease as the depth from the top surface of the interlayer dielectric layer 13 increases. Furthermore, the contact hole 15 may have a wineglass shape.

Then, a contact plug 17 may be formed in the lower region of the contact hole 15, for example, by gap-filling the lower region of the contact hole 15. Thus, the top surface of the contact plug 17 may be positioned at a low level than the top surface of the interlayer dielectric layer 13 or the entrance of the contact hole 15. The contact plug 17 may have a singe-layer structure or multilayer structure including various conductive materials such as metal or metal oxide, which have an excellent burial characteristic and high electrical conductivity. For example, the contact plug 17 may include W or TiN.

The contact plug 17 may be formed through a series of processes. For example, the contact plug 17 is formed by forming a conductive material on the entire surface of the resultant structure to gap-fill the contact hole 15 and then sequentially performing a planarization process and a blanket etch process. The planarization process may include chemical-mechanical polishing (CMP), and the blanket etch process may include an etch-back process. In some implementations, the planarization process may be omitted. Although not illustrated in FIG. 4A, a void or seam may be formed in the contact plug 17 during the process of gap-filling the contact hole 15. Thus, the blanket etch process may be performed to expose the void or seam formed in the contact plug 17. The exposed defect in the contact plug 17 can be removed as will be explained later.

Figure 4B:
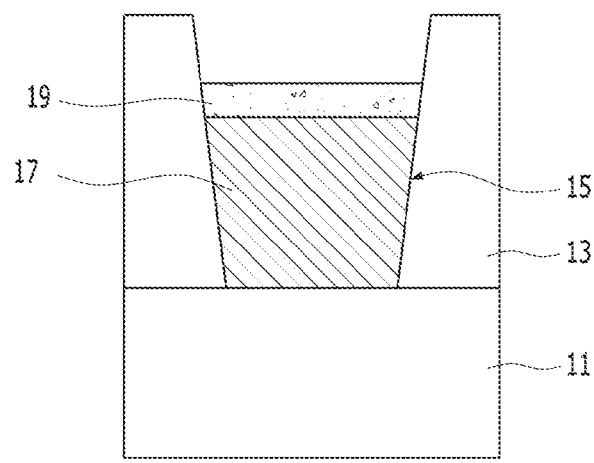

As illustrated in FIG. 4B, an amorphous buffer layer 19 is formed over the contact plug 17. At this time, the amorphous buffer layer 19 may be formed in a plate shape to gap-fill a part of the contact hole 15 over the contact plug 17. For this structure, the buffer layer 19 may be formed through a series of processes including forming a buffer layer on the entire surface of the resultant structure to gap-fill the contact hole 15 and then sequentially performing a planarization process and a blanket etch process. The planarization process may include CMP, and the blanket etch process may include an etch-back process. In some implementations, the planarization process may be omitted. At this time, an exposed defect of the contact plug 17, for example, a void or seam, can be removed during the process of forming the buffer layer 19. That is, the buffer layer 19 gap-fills the void or seam exposed, thereby preventing characteristic deterioration caused by the defect of the contact plug 17.

The amorphous buffer layer 19 may have a single-layer or multilayer structure including a metal, a nitride of the metal, or an oxide of the metal. The metal may include Ti, Hf, Zr, Mn, Cr, Zn, Mg, Al, W, or Ta or the combination thereof.

The amorphous buffer layer 19 may include one or more dopants including Ge, Ar, Xe, In, Sb, or As doped with the above-described metal, metal nitride, or metal oxide.

The amorphous buffer layer 19 may include a carbon containing layer or silicon containing layer. The carbon containing layer or silicon containing layer may be doped with a predetermined impurity to have conductivity. At this time, the impurity may include an N-type impurity such as P or As or a P-type impurity such as B.

The amorphous buffer layer 19 may have an amorphous characteristic at the deposition of the amorphous buffer layer 19, or the amorphous characteristic may be given after the deposition through a predetermined process. For example, the amorphous buffer layer 19 may include TaN, TiN, or WN that allows the amorphous buffer layer 19 to have the amorphous characteristic at the deposition. In some implementations, the buffer layer 19 may be formed through a series of processes including forming a crystalline Ta layer and then amorphizing the Ta layer by implanting Ge into the Ta layer.

Referring to FIGS. 2 and 3, the amorphous buffer layer 19 may be formed in a liner shape. The amorphous buffer layer 19 illustrated in FIG. 2 may be formed through a series of processes including forming an amorphous buffer layer along the surface of the structure including the contact plug 17 and then performing a planarization process until the interlayer dielectric layer 13 is exposed. The amorphous buffer layer 19 illustrated in FIG. 3 may be formed through a series of processes including forming an amorphous buffer layer along the surface of the structure including the contact plug 17, forming a sacrificial layer, for example, by gap-filling a part of the contact hole 15, for example, by gap-filling, and then performing wet etching using the sacrificial layer as an etch barrier.

Figure 4C:
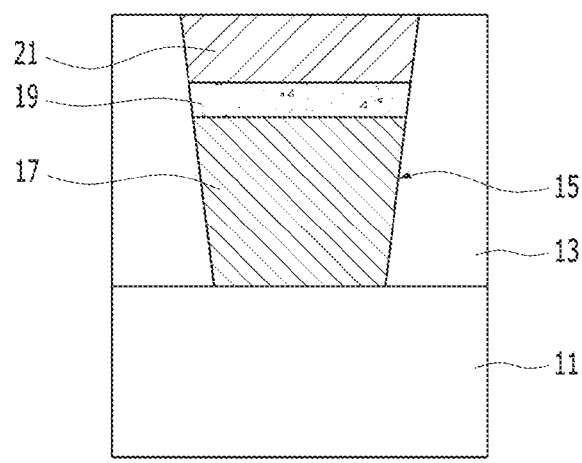

As illustrated in FIG. 4C, a contact pad 21 may be formed in the remaining part of the contact hole 15 over the amorphous buffer layer 19. In some implementations, the contact pad 21 can be formed by gap-filling the remaining part of the contact hole 15. The contact pad 21 may have a single-layer structure or multilayer structure including various conductive materials such as metal or metal nitride. The contact pad 21 may be formed through a series of processes including depositing a conductive material on the entire surface of the resultant structure so as to gap-fill at least the contact hole 15 and then performing a blanket etch process until the interlayer dielectric layer 13 is exposed. The planarization process may include CMP. As the defect in the contact plug 17 is already removed by the amorphous buffer layer 19 in advance, the occurrence of dishing can be prevented during the process of forming the contact pad 21. Furthermore, the surface roughness of the contact pad 21 can be improved.

Figure 4D:
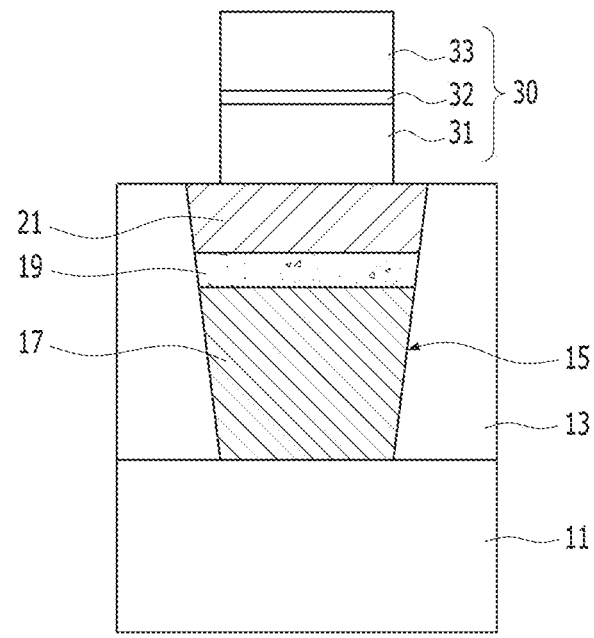

As illustrated in FIG. 4D, a variable resistance element 30 may be formed over the contact pad 21. The variable resistance element 30 may be formed as an MTJ structure having a tunnel barrier interposed between two magnetic substances. In some implementations, the variable resistance element 30 may be formed through a series of processes including forming a multilayer structure in which a free layer 31, a tunnel barrier layer 32, and a pinned layer 33 are sequentially stacked, and then etching the multilayer structure using a mask pattern (not illustrated) as an etch layer.

The variable resistance element 30 may have a smaller CD than the contact pad 21. Thus, the entire variable resistance element 30 may be formed to overlap with the contact pad 21, and the entire variable resistance element 30 positioned over the contact pad 21.

Then, the semiconductor memory in accordance with the implementation can be completed by using a suitable fabrication technology including, e.g., some of the publicly-known semiconductor fabrication technologies.

In accordance with the implementations, as the amorphous buffer layer is formed between the contact plug and the contact pad, it is possible to improve the stability for the process of forming the variable resistance element and the characteristic of the variable resistance element. Thus, the reliability of the semiconductor memory including the variable resistance element and the electronic device including the semiconductor memory can be improved as well.

The semiconductor memory in accordance with the implementation of the present disclosure may be applied to diverse electronic devices or systems. FIGS. 5 to 9 show some examples of electronic devices or systems that can implement the semiconductor memory disclosed herein.

Figure 5:
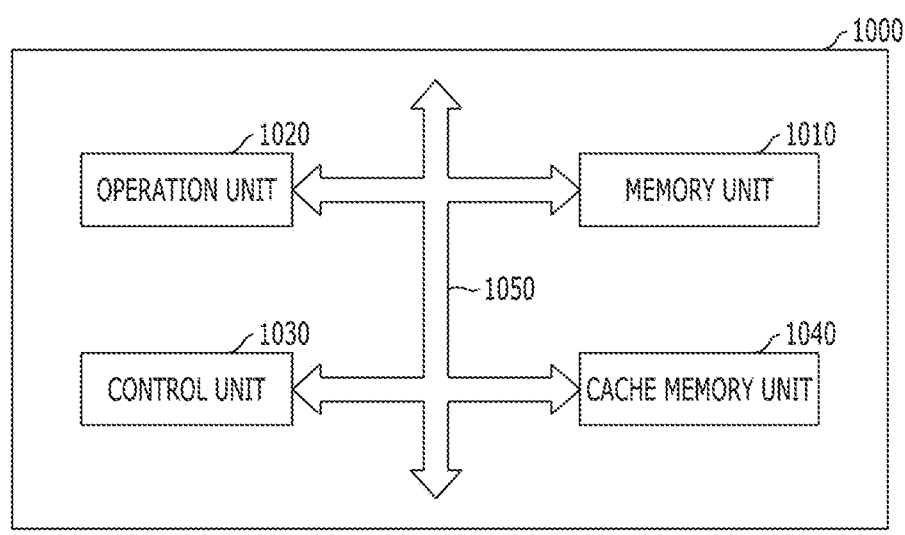
FIG. 5 is an example of configuration diagram of a microprocessor implementing memory circuitry based on the disclosed technology.

Referring to FIG. 5, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. The memory unit 1010 may include semiconductor memory. The semiconductor memory may include an interlayer dielectric layer formed over a substrate and having a contact hole, a contact plug formed in a lower part of the contact hole, a contact pad formed in an upper part of the contact hole, an amorphous buffer layer interposed between the contact plug and the contact pad, and a variable resistance element formed over the contact pad. As the amorphous buffer layer is formed between the contact plug and the contact pad, it is possible to improve the stability for the process of forming the variable resistance element and the characteristic of the variable resistance element, thereby improving the reliability of the semiconductor memory including the variable resistance element and the electronic device including the semiconductor memory. Through this, the memory unit 1010 and the microprocessor 1000 may have improved reliability.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 6:
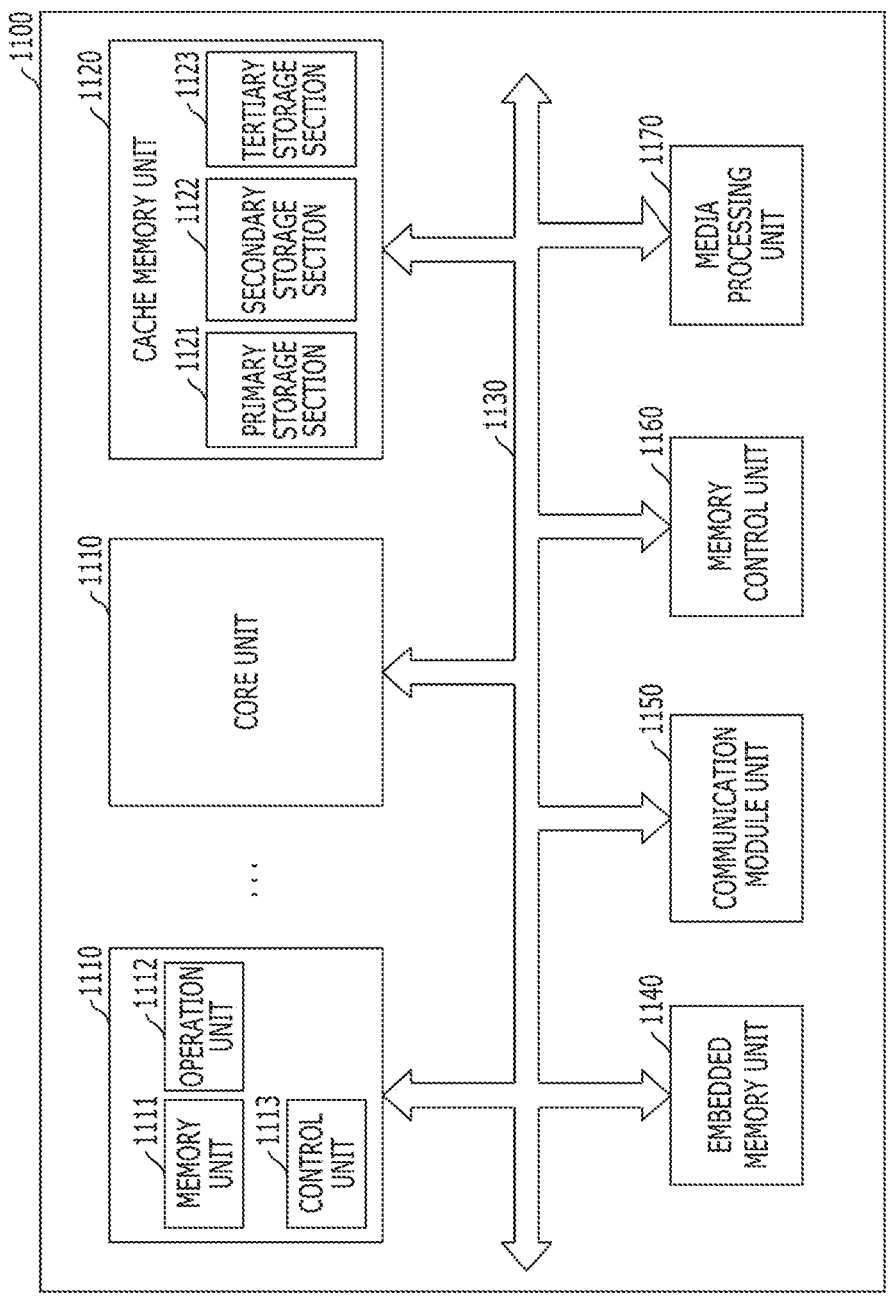
FIG. 6 is an example of configuration diagram of a processor implementing memory circuitry based on the disclosed technology.

FIG. 6 is an example of configuration diagram of a processor implementing memory circuitry based on the disclosed technology.

Referring to FIG. 6, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include semiconductor memory. The semiconductor memory may include an interlayer dielectric layer formed over a substrate and having a contact hole, a contact plug formed in a lower part of the contact hole, a contact pad formed in an upper part of the contact hole, an amorphous buffer layer interposed between the contact plug and the contact pad, and a variable resistance element formed over the contact pad. As the amorphous buffer layer is formed between the contact plug and the contact pad, it is possible to improve the stability for the process of forming the variable resistance element and the characteristic of the variable resistance element, thereby improving the reliability of the semiconductor memory including the variable resistance element and the electronic device including the semiconductor memory. Through this, the cache memory unit 1120 and the processor 1100 may have improved reliability.

Although it was shown in FIG. 6 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 7:
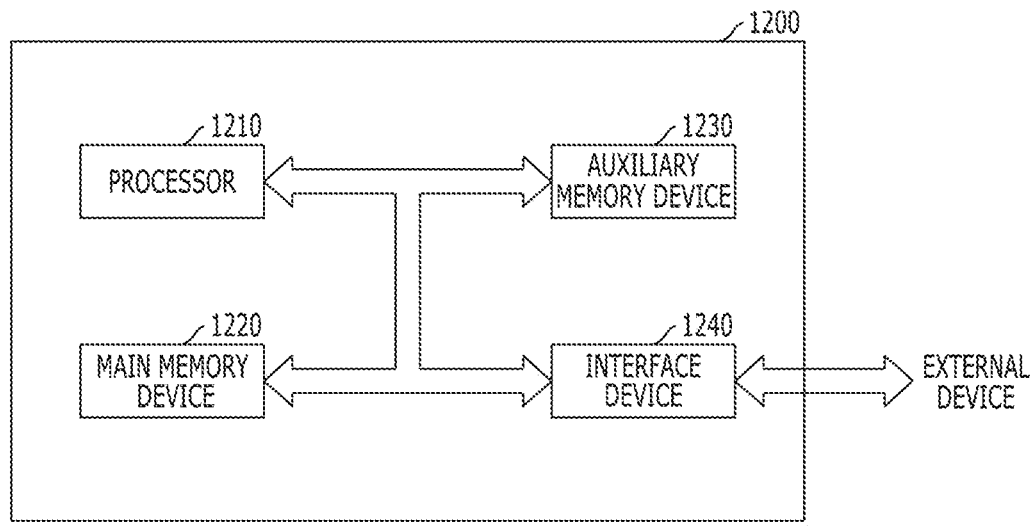
FIG. 7 is an example of configuration diagram of a system implementing memory circuitry based on the disclosed technology.

FIG. 7 is an example of configuration diagram of a system implementing memory circuitry based on the disclosed technology.

Referring to FIG. 7, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include semiconductor memory. The semiconductor memory may include an interlayer dielectric layer formed over a substrate and having a contact hole, a contact plug formed in a lower part of the contact hole, a contact pad formed in an upper part of the contact hole, an amorphous buffer layer interposed between the contact plug and the contact pad, and a variable resistance element formed over the contact pad. As the amorphous buffer layer is formed between the contact plug and the contact pad, it is possible to improve the stability for the process of forming the variable resistance element and the characteristic of the variable resistance element, thereby improving the reliability of the semiconductor memory including the variable resistance element and the electronic device including the semiconductor memory. Through this, the main memory device 1220 and the system 1200 may have improved reliability.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include semiconductor memory. The semiconductor memory may include an interlayer dielectric layer formed over a substrate and having a contact hole, a contact plug formed in a lower part of the contact hole, a contact pad formed in an upper part of the contact hole, an amorphous buffer layer interposed between the contact plug and the contact pad, and a variable resistance element formed over the contact pad. As the amorphous buffer layer is formed between the contact plug and the contact pad, it is possible to improve the stability for the process of forming the variable resistance element and the characteristic of the variable resistance element, thereby improving the reliability of the semiconductor memory including the variable resistance element and the electronic device including the semiconductor memory. Through this, the auxiliary memory device 1230 and the system 1200 may have improved reliability.

Also, the auxiliary memory device 1230 may further include a data storage system (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 8:
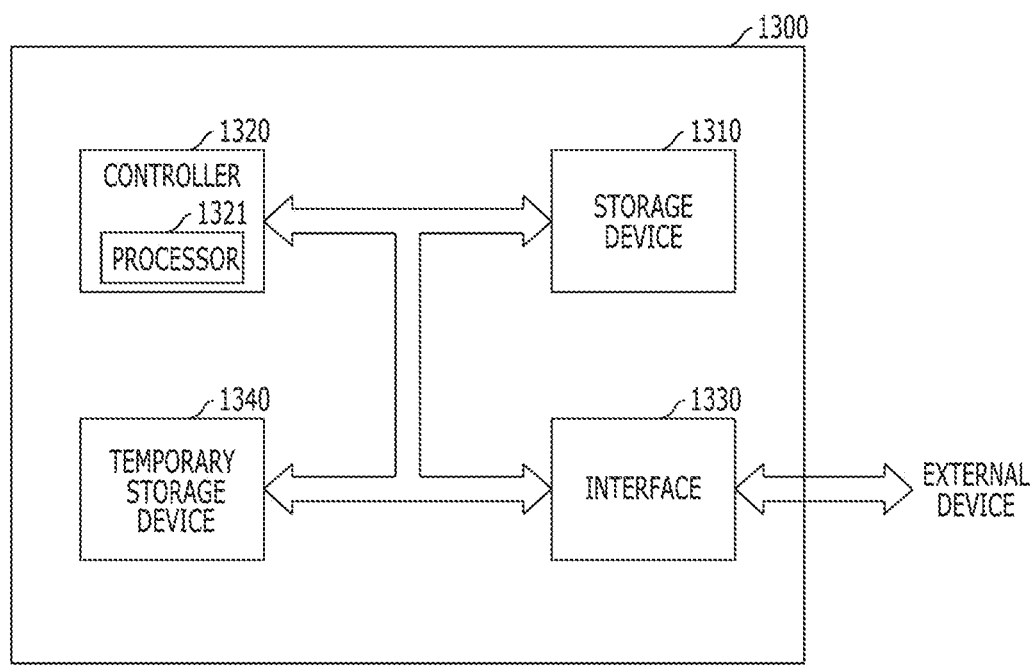
FIG. 8 is an example of configuration diagram of a data storage system implementing memory circuitry based on the disclosed technology.

FIG. 8 is an example of configuration diagram of a data storage system implementing memory circuitry based on the disclosed technology.

Referring to FIG. 8, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include semiconductor memory. The semiconductor memory may include an interlayer dielectric layer formed over a substrate and having a contact hole, a contact plug formed in a lower part of the contact hole, a contact pad formed in an upper part of the contact hole, an amorphous buffer layer interposed between the contact plug and the contact pad, and a variable resistance element formed over the contact pad. As the amorphous buffer layer is formed between the contact plug and the contact pad, it is possible to improve the stability for the process of forming the variable resistance element and the characteristic of the variable resistance element, thereby improving the reliability of the semiconductor memory including the variable resistance element and the electronic device including the semiconductor memory. Through this, the temporary storage device 1340 and the data storage system 1300 may have improved reliability.

Figure 9:
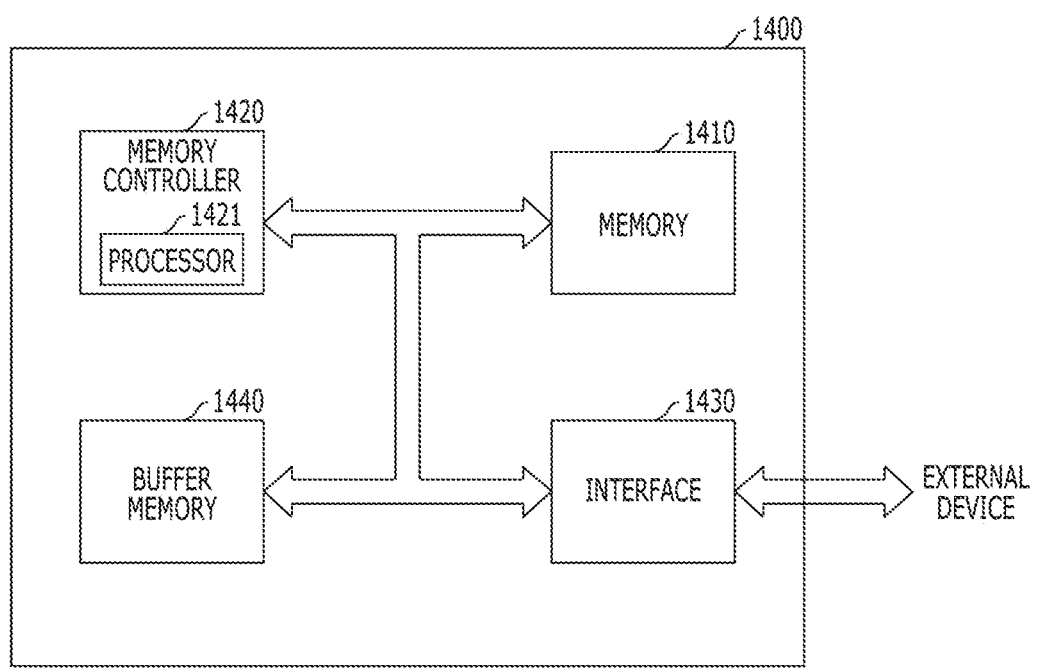
FIG. 9 is an example of configuration diagram of a memory system implementing memory circuitry based on the disclosed technology.

FIG. 9 is an example of configuration diagram of a memory system implementing memory circuitry based on the disclosed technology.

Referring to FIG. 9, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include semiconductor memory. The semiconductor memory may include an interlayer dielectric layer formed over a substrate and having a contact hole, a contact plug formed in a lower part of the contact hole, a contact pad formed in an upper part of the contact hole, an amorphous buffer layer interposed between the contact plug and the contact pad, and a variable resistance element formed over the contact pad. As the amorphous buffer layer is formed between the contact plug and the contact pad, it is possible to improve the stability for the process of forming the variable resistance element and the characteristic of the variable resistance element, thereby improving the reliability of the semiconductor memory including the variable resistance element and the electronic device including the semiconductor memory. Through this, the memory 1410 and the memory system 1400 may have improved reliability.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 may include semiconductor memory. The semiconductor memory may include an interlayer dielectric layer formed over a substrate and having a contact hole, a contact plug formed in a lower part of the contact hole, a contact pad formed in an upper part of the contact hole, an amorphous buffer layer interposed between the contact plug and the contact pad, and a variable resistance element formed over the contact pad. As the amorphous buffer layer is formed between the contact plug and the contact pad, it is possible to improve the stability for the process of forming the variable resistance element and the characteristic of the variable resistance element, thereby improving the reliability of the semiconductor memory including the variable resistance element and the electronic device including the semiconductor memory. Through this, the buffer memory 1440 and the memory system 1400 may have improved reliability.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 5 to 9 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory,
   wherein the semiconductor memory comprises:
   an interlayer dielectric layer formed over a substrate and having a contact hole;
   a contact plug formed in a lower part of the contact hole;
   a contact pad formed in an upper part of the contact hole;
   an amorphous buffer layer interposed between the contact plug and the contact pad; and
   a variable resistance element formed over the interlayer dielectric layer,
   wherein the amorphous buffer layer includes a metal doped with one or more dopants including argon (Ar), xenon (Xe), indium (In), selenium (Se), or arsenic (As).

2. The electronic device of claim 1, wherein the amorphous buffer layer has a shape of a plate interposed between the contact plug and the contact pad.

3. The electronic device of claim 1, wherein the amorphous buffer layer has a shape of a liner interposed between the contact plug and the contact pad and between the contact pad and the contact hole.

4. The electronic device of claim 3, wherein an end of the amorphous buffer layer interposed between the contact pad and the contact hole is positioned in the contact pad.

5. The electronic device of claim 1, wherein the amorphous buffer layer has a single-layer or multilayer structure including the metal including titanium (Ti), hafnium (Hf), zirconium (Zr), manganese (Mn), chrome (Cr), zinc (Zn), magnesium (Mg), aluminum (Al), tungsten (W), or tantalum (Ta).

6. The electronic device of claim 1, wherein the amorphous buffer layer comprises a carbon containing layer or silicon containing layer.

7. The electronic device of claim 1, wherein the contact plug and the contact pad comprise different materials.

8. The electronic device of claim 1, wherein the variable resistance element has a smaller critical dimension (CD) than the contact pad.

9. The electronic device of claim 1, wherein the variable resistance element comprises a magnetic tunnel junction (MTJ) having a tunnel barrier interposed between two magnetic substances.

10. The electronic device of claim 1, wherein the variable resistance element comprises a metal oxide, a phase change material, or a ferroelectric material.

11. The electronic device according to claim 1, further comprising a microprocessor which includes:

a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

12. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

13. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

14. The electronic device according to claim 1, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

15. The electronic device according to claim 1, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

16. The electronic device of claim 1, wherein a bottom surface of the variable resistance element is smaller than an upper surface of the contact pad.

17. The electronic device of claim 1, wherein an area of an upper surface of the contact pad is greater than an area of a bottom surface the contact pad.

* * * * *